United States Patent
Yang et al.

(10) Patent No.: US 10,481,854 B2
(45) Date of Patent: Nov. 19, 2019

(54) DISPLAY DEVICE

(71) Applicants: BOE Technology Group Co., Ltd., Beijing (CN); Beijing BOE Display Technology Co., Ltd., Beijing (CN)

(72) Inventors: Xiaojian Yang, Beijing (CN); Hui Zheng, Beijing (CN); Hanyan Sun, Beijing (CN); Bing Bai, Beijing (CN); Inho Park, Beijing (CN); Weitao Chen, Beijing (CN)

(73) Assignees: BOE TECHNOLOGY GROUP CO., LTD., Beijing (CN); BEIJING BOE DISPLAY TECHNOLOGY CO., LTD, Beijing (CN)

( * ) Notice: Subject to any disclaimer, the term of this patent is extended or adjusted under 35 U.S.C. 154(b) by 74 days.

(21) Appl. No.: 15/706,254

(22) Filed: Sep. 15, 2017

(65) Prior Publication Data

US 2018/0232189 A1    Aug. 16, 2018

(30) Foreign Application Priority Data

Feb. 10, 2017    (CN) .......................... 2017 1 0072956

(51) Int. Cl.
*G06F 3/147*        (2006.01)
*H05K 5/00*         (2006.01)
(Continued)

(52) U.S. Cl.
CPC ........... *G06F 3/147* (2013.01); *G02B 27/017* (2013.01); *G09G 3/3208* (2013.01); *G09G 5/00* (2013.01);
(Continued)

(58) Field of Classification Search
CPC ....... G06F 3/147; G06F 3/3208; G02B 27/07; G09G 3/3208; G09G 5/00; G09G 2380/02; H05K 5/0217; H05K 5/0017; H05K 5/03
See application file for complete search history.

(56) References Cited

U.S. PATENT DOCUMENTS 8,253,652 B2    8/2012 Koo et al.
2011/0186869 A1*  8/2011 Hong ...................... H01L 51/52
                                                   257/88
(Continued)

FOREIGN PATENT DOCUMENTS

CN    101064081 A    10/2007
CN    205301721 U     6/2016
(Continued)

OTHER PUBLICATIONS

First Office Action, including Search Report, for Chinese Patent Application No. 201710072956.6, dated Sep. 28, 2018, 10 pages.

*Primary Examiner* — Sahlu Okebato
(74) *Attorney, Agent, or Firm* — Westman, Champlin & Koehler, P.A.

(57) ABSTRACT

A display device includes a housing. A plurality of display screens are provided in the housing, and each display screen includes a transparent display panel. The housing is provided with a viewing portion for viewing an image displayed on the transparent display panel, the plurality of display screens are successively arranged in a direction leaving away from the viewing portion, a plurality of the transparent display panels are configured for respectively displaying images at different depths of field in a same scene, and the image displayed on the transparent display panel has a depth of field which is associated with a distance between the transparent display panel and the viewing portion.

16 Claims, 3 Drawing Sheets

(51) Int. Cl.
 *H05K 5/03* (2006.01)
 *G09G 3/3208* (2016.01)
 *H05K 5/02* (2006.01)
 *G02B 27/01* (2006.01)
 *G09G 5/00* (2006.01)

(52) U.S. Cl.
 CPC ......... *H05K 5/0017* (2013.01); *H05K 5/0217* (2013.01); *H05K 5/03* (2013.01); *G09G 2380/02* (2013.01)

(56) References Cited

U.S. PATENT DOCUMENTS

| | | | | |
|---|---|---|---|---|
| 2014/0217373 | A1* | 8/2014 | Youn | H01L 23/4985 257/40 |
| 2015/0351277 | A1* | 12/2015 | Frank | H05K 7/1489 361/679.33 |
| 2016/0378203 | A1* | 12/2016 | Kim | G06F 1/1616 345/156 |
| 2017/0301145 | A1* | 10/2017 | Miller | G06F 1/163 |
| 2017/0323485 | A1* | 11/2017 | Samec | G06F 3/013 |

FOREIGN PATENT DOCUMENTS

| | | |
|---|---|---|
| CN | 205880368 U | 1/2017 |
| CN | 106371222 A | 2/2017 |
| CN | 106681512 A | 5/2017 |

\* cited by examiner

DISPLAY DEVICE

CROSS-REFERENCE TO RELATED APPLICATION

This application claims the benefit of Chinese Patent Application No. 201710072956.6 filed on Feb. 10, 2017 in the State Intellectual Property Office of China, the disclosure of which is incorporated in entirety herein by reference.

BACKGROUND

Technical Field

Embodiments of the present disclosure relate to a field of display technology or a field of virtual reality technology, and more particularly, to a display device.

Description of the Related Art

With the development of science and technology, Virtual Reality (referred to as VR) display technology is gradually coming into people's lives. Virtual reality glasses for achieving a virtual reality display can provide a wearer with immersive visual experience. The conventional virtual reality glasses have the following shortcomings: when a user wears the virtual reality glasses, a distance between the screen and the user's eyeballs is constant, that is, the focal point will never change for a long time, but in the virtual scene presented by the virtual reality glasses, different images have different "depth of field" information. For example, a virtual scene includes an image of an object a and an image of an object b, and the object a and the object b are observed by human's eyes at different distances in front of the human's eyes, however the eyeball's focal point is not accordingly adjusted, which is very easy to lead to dizziness, nausea, vomiting and other symptoms, thereby affecting user's experience.

SUMMARY

In an embodiment of the present disclosure, there is provided a display device comprising a housing, wherein a plurality of display screens are provided in the housing, and each display screen comprises a transparent display panel, wherein the housing is provided with a viewing portion for viewing an image displayed on the transparent display panel, the plurality of display screens are successively arranged in a direction leaving away from the viewing portion, a plurality of the transparent display panels are configured for respectively displaying images at different depths of field in a same scene, and the image displayed on the transparent display panel has a depth of field which is associated with a distance between the transparent display panel and the viewing portion.

As an example, the transparent display panel is an organic light-emitting diode display panel.

As an example, two mounting blocks are arranged opposite to each other in the housing, the display screens are arranged between the two mounting blocks, each mounting block is provided with mounting grooves each corresponding to one of the display screens, and two ends of the display screen in a longitudinal or transverse direction thereof respectively extend into the mounting grooves in the two mounting blocks.

As an example, in the mounting block, an inner wall of the mounting groove comprises a bottom wall facing the other mounting block and side walls connected to the bottom wall, and a chamfer surface is provided between the side wall of the mounting groove and a surface of the mounting block facing the other mounting block.

As an example, the transparent display panel is a flexible display panel, and a curvature adjustment structure is further provided in the housing for adjusting curvatures of the transparent display panels.

As an example, the curvature adjustment structure comprises at least one driver and a threaded rod connected to the driver, the driver is configured for driving the threaded rod to rotate about its own axis, and the driver is fixedly provided on the housing.

As an example, each display screen is provided with a threaded hole matching with the threaded rod at a symmetrical middle plane between the two mounting blocks, and the threaded rod successively passes through the threaded holes of the plurality of display screens matching with the threaded rod.

As an example, the display screen further comprises a fixing frame surrounding the transparent display panel and located in a same plane as the transparent display panel, the transparent display panel is fixedly connected to the fixing frame, the fixing frame comprises two first fixing portions arranged in a longitudinal direction of the transparent display panel and two second fixing portions arranged in a transverse direction of the transparent display panel, the two ends of the display screen in the longitudinal direction thereof extend into the mounting grooves of the mounting blocks, and the fixing frame is made of a flexible material.

As an example, the curvature adjustment structure comprises two drivers and two threaded rods, each display screen is provided with two threaded holes corresponding to the two threaded rods, and the two threaded holes are respectively located in the two second fixing portions of the display screen.

As an example, at least one pair of connection strips are provided between the two mounting blocks, two ends of each connection strip are respectively connected to the two mounting blocks, two paired connection strips are respectively provided on either side of the plurality of display screens in an a direction along which they are arranged, a position of the connection strip corresponds to a position of the second fixing portion, the connection strip is provided with a guiding hole corresponding to the threaded rod, and the threaded rod passes through the corresponding guiding hole.

As an example, the flexible material comprises polyformaldehyde.

As an example, the housing comprises a front cover, a rear cover opposite to the front cover, and an annular casing disposed between the front cover and the rear cover, and the mounting block is disposed inside the annular casing.

As an example, the mounting block is provided with a heat dissipation hole, an opening of the heat dissipation hole at one end faces towards an interior of the housing, an opening of the heat dissipation hole at the other end faces towards the annular casing, and a portion of the annular casing corresponding to the heat dissipation hole is formed as an opaque heat dissipation portion.

As an example, the heat dissipation portion is made from a material comprising a thermally conductive carbon fiber.

As an example, the housing comprises a front cover, a rear cover opposite to the front cover, and an annular casing disposed between the front cover and the rear cover, the front cover is provided with a mounting hole, and the viewing portion comprises a lens disposed in the mounting hole.

As an example, a light shielding sheet is provided between the rear cover and the annular casing.

BRIEF DESCRIPTION OF THE DRAWINGS

The accompanying drawings are intended to provide a further understanding of the embodiments of the present disclosure and constitute a part of the specification. The accompanying drawings are used to explain the present disclosure together with the following specific embodiments, but they should not be construed as limiting the present disclosure. In the drawings.

DETAILED DESCRIPTION OF PREFERRED EMBODIMENTS

Hereinafter, the specific embodiments of the present disclosure will be described in detail with reference to the accompanying drawings. It should be understood that the specific embodiments described herein are intended to illustrate and explain the present disclosure, but not limit the present disclosure.

The embodiments of the present disclosure are intended to at least partially address the technical problems that exist in the related art, and therefore propose a head-mounted virtual reality device to improve the user's experience.

Figure 1:
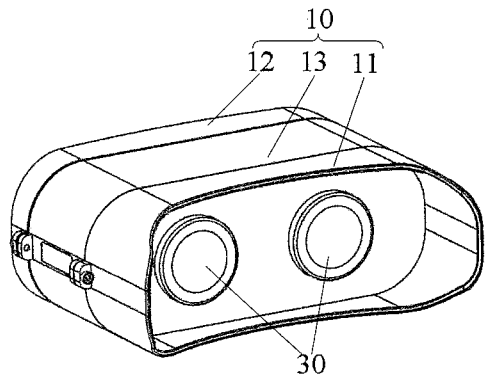
FIG. 1 is an overall schematic view of a head-mounted virtual reality device according to an embodiment of the present disclosure.
Figure 2:
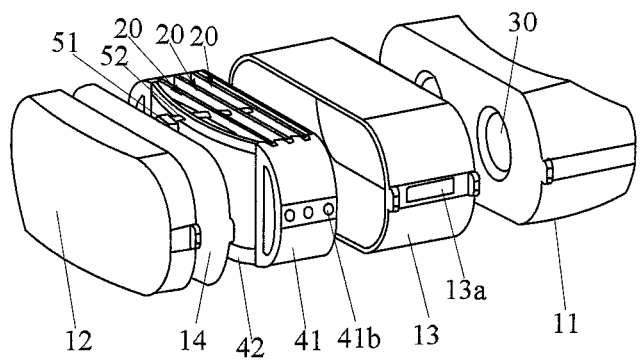
FIG. 2 is an exploded schematic view of the head-mounted virtual reality device according to the embodiment of the present disclosure.
Figure 3:
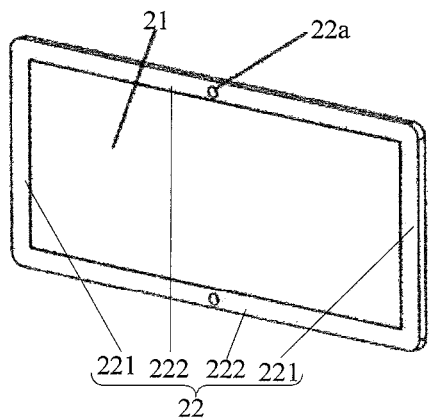
FIG. 3 is a schematic view of a display screen of the head-mounted virtual reality device according to the embodiment of the present disclosure.

An embodiment of the present disclosure provides a display device, for example, a head-mounted virtual reality device. FIG. 1 is an overall schematic view of the head-mounted virtual reality device; FIG. 2 is an exploded schematic view of the head-mounted virtual reality device; and FIG. 3 is a schematic view of a display screen of the head-mounted virtual reality device. As shown in FIGS. 1-3, the head-mounted virtual reality device includes a housing 10, a plurality of display screens 20 are provided in the housing 10, and each display screen 20 comprises a transparent display panel 21. The housing 10 is provided with a viewing portion 30 for viewing an image displayed on the transparent display panel 21, the plurality of display screens 20 are successively arranged in a direction leaving away from the viewing portion 30, a plurality of transparent display panels 21 are configured for respectively displaying images at different depths of field in a same scene, and the image displayed on the transparent display panel 21 has a depth of field which is associated with (positively correlated with) a distance between the transparent display panel 21 and the viewing portion 30. It will be appreciated that the number of the viewing portions 30 may be two, and the two viewing portions 30 correspond to eyes of a user, respectively.

The transparent display panel 21 in the embodiment of the present disclosure can transmit light rays to the viewing portion 30 and ensure that the light rays from another transparent display panel 21 arranged behind it (i.e., at the side of the transparent display panel 21 away from viewing portion 30) are transmitted to the viewing portion 30, without conflict. The "depth of field" in the embodiment of the present disclosure can be regarded as a distance between an image observed by human eyes and the human eyes. When the transparent display panel 21 is displaying, the transparent display panel 21 provides different light rays for user's eyes so that the user's eyes see different contents, then they are mixed into a stereoscopic image in the user's brain, and the user feels that the stereoscopic image is located at a certain distance in front thereof, this distance is the depth of field of the image displayed on the transparent display panel 21.

For example, a scene to be displayed by the head-mounted virtual reality device includes images of an object a, an object b and an object c, and a depth of field of the object b is greater than a depth of field of the object a and less than a depth of field of the object c. In this situation, when displaying, the image of the object a may be displayed on the transparent display panel 21 closest to the viewing portion 30, the image of the object b may be displayed on the intermediate transparent display panel 21, and the image of the object c may be displayed on the transparent display panel 21 farthest from the viewing portion 30, and the image of the object a seen by the human eyes located at the viewing portion 30 is closest to the human eyes, the image of the object b is moderately distant, and the image of the object c is farthest away from the human eyes.

In the embodiment of the present disclosure, when the head-mounted virtual reality device performs a virtual display, the different transparent display panels 21 display images of different depth of field, and the images displayed by the plurality of transparent display panels 21 are mixed to form a complete virtual scene. The image displayed by the transparent display panel 21 closer to the user has a relatively smaller depth of field, and the image displayed by the transparent display panel 21 farther from the user has a relatively larger depth of field. Therefore, when the user is watching, he/she will no longer see images of different depths of field at the same position, but see images of different depths of field at different positions. Thus, the position of focal point is allowed to be in correspondence with the depth of field of the image, further, it avoids dizziness, nausea and other symptoms caused by the fact that the user sees the images of different depths of field at the same focus for a long time in the related art, thereby improving the viewing experience for the user.

It should be understood that the housing 10 may be of an opaque structure in order to ensure that the user experiences a good immersive effect.

Specifically, as shown in FIGS. 1 and 2, the housing 10 may include a front cover 11, a rear cover 12 opposite to the front cover and an annular casing 13 disposed between the front cover 11 and the rear cover 12, the annular casing 13 is connected to the front cover 11 and the rear cover 12 by fasteners. Herein, "front" and "rear" are relative terms, an observation direction of a human eye may be taken as a reference when the head-mounted virtual reality device is worn, a position close to the human eye is "front" and a position far away from the human eye is "rear"; or a position close to the human eye is "rear" and a position far away from the human eye is "front". The front cover 11 is provided with a mounting hole, and the viewing portion 30 comprises a lens disposed in the mounting hole. As an example, a battery for supplying power to the head-mounted virtual reality device and a circuit board for driving the transparent display panel 21 to display an image may be fixed to the rear cover 12. Alternatively, they may also be fixed to the front cover 11, or may be fixed to different portions of the housing respectively.

In order to ensure enough light shielding effect of the housing 10, as shown in FIG. 2, a light shielding sheet 14 is provided between the rear cover 12 and the annular casing 13. Moreover, the front cover 11 may be shaped to match the contour of a head of a human body.

In an embodiment of the present disclosure, the transparent display panel 21 may be selected as an organic light-emitting diode (referred to as OLED) display panel. Compared with a liquid crystal display panel, the organic light-emitting diode display panel has a faster response speed, thus it can alleviate dynamic blurring caused by a response delay, thereby improving the display effect. Moreover, the organic light-emitting diode display panel is lighter and thinner, therefore, it reduces the overall weight of the head-mounted virtual reality device to facilitate the wearing.

Further optionally, as shown in FIGS. 2 and 4 to 8, the housing 10 is provided with two mounting blocks 41, which are provided inside the annular casing 13, and the transparent display panels 21 are provided between the two mounting blocks 41. Each mounting block 41 is provided with mounting grooves 41a each corresponding to one of the transparent display panels 21, and two ends of the display screen 20 in a longitudinal or transverse direction thereof respectively extend into the mounting grooves 41a in the two mounting blocks 41. The transparent display panel 21 is a flexible display panel, and the housing 10 is further provided with a curvature adjustment structure for adjusting curvatures of the transparent display panels 21. By means of the curvature adjustment structure, the transparent display panel may be switched between a planar state (shown in FIGS. 4 and 5) and a bending state (shown in FIGS. 6 and 7). If the transparent display panel 21 is bent (specifically, protruding towards the rear cover 12), a bending surface display may be performed. When a bending surface display is performed, in contrast to a flat display, two sides and the center of the transparent display panel 21 are spaced away from the human eyes by substantially the same distance. In this way, the user is more strongly immersed in the scene, thereby it provides a better viewing experience for the user. In addition, when the users with different interpupillary distances are viewing a transparent display panel 21 of an invariant curvature, different viewing effects are felt. While the curvature adjustment structure in the embodiment of the present disclosure can adjust the curvature of the transparent display panel 21 so as to satisfy the users of different interpupillary distances. It should be understood that an arrangement direction of the two mounting blocks 41 is the same as an arrangement direction of viewing positions of two eyes of the user, i.e., a connection line of centers of the two mounting blocks 41 is parallel to a connection line of the user's eyes. It should be noted that the arrangement direction of two or more components in the present disclosure refers to a direction along a connection line of two or more components.

Figure 8:
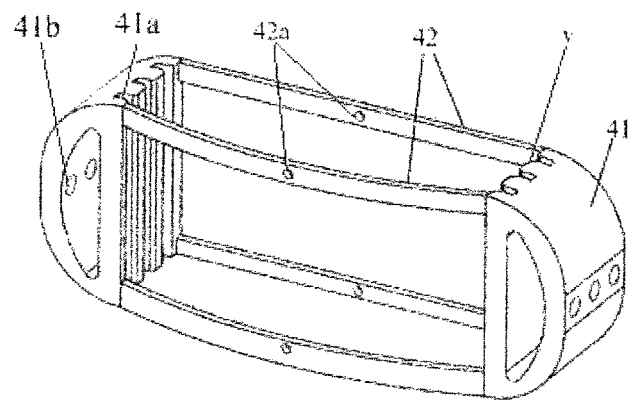
FIG. 8 is a schematic structural view of a mounting block and a connection strip of the head-mounted virtual reality device according to the embodiment of the present disclosure.

In any one of the mounting blocks 41, an inner wall of the mounting groove 41a comprises a bottom wall facing the other mounting block 41 and side walls connected to the bottom wall, and a chamfer surface v is provides between the side wall of the mounting groove 41a and a surface of the mounting block 41 facing the other mounting block 41 (as shown in FIG. 8). The arrangement of the chamfer surface v can increase contact area between the mounting block 41 and the transparent display panel 21 and prevent scratching the transparent display panel 21 when the transparent display panel 21 is bent.

The curvature adjustment structure is shown in FIGS. 4 to 7. The curvature adjustment structure comprises at least one driver 51 and a threaded rod 52 connected to the driver 51, the driver 51 is configured for driving the threaded rod 52 to rotate about its own axis, and the driver 51 is fixedly provided on the housing 10. Each display screen 20 is provided with a threaded hole 22a matching with the threaded rod 52 at a symmetrical middle plane between the two mounting blocks 41, and the threaded rod 52 successively passes through the threaded holes 22a of the plurality of display screens 20 matching with the threaded rod 52. Herein, the driver 51 may be a micro motor, which may be fixed to the rear cover 12.

Figure 4:
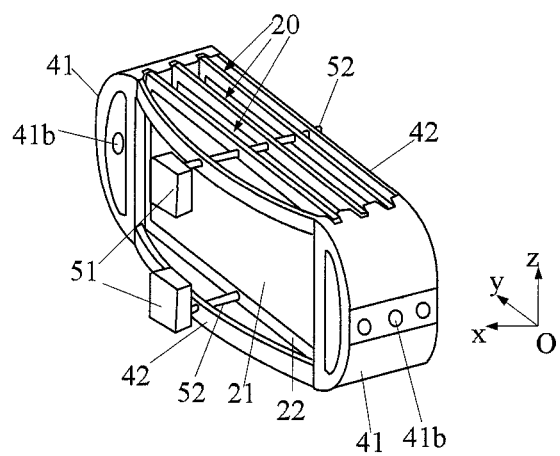
FIG. 4 is a schematic view of the head-mounted virtual reality device according to the embodiment of the present disclosure in which the display screen is in a planar state.
Figure 5:
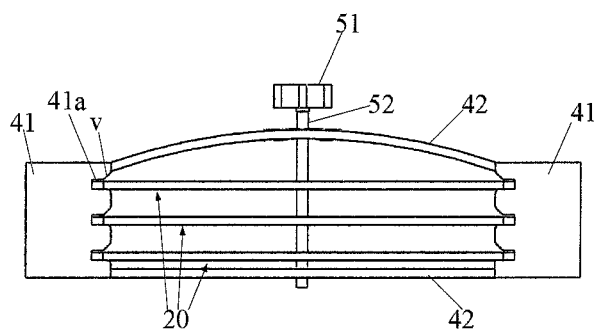
FIG. 5 is a cross sectional view taken along the xoy plane in FIG. 4.
Figure 6:
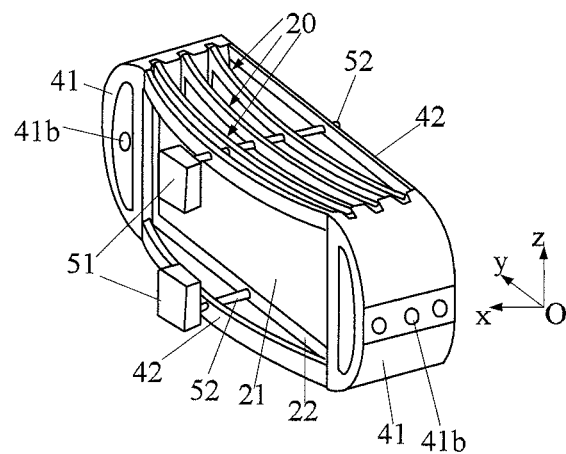
FIG. 6 is a schematic view of the head-mounted virtual reality device according to the embodiment of the present disclosure in which the display screen is in a bending state.
Figure 7:
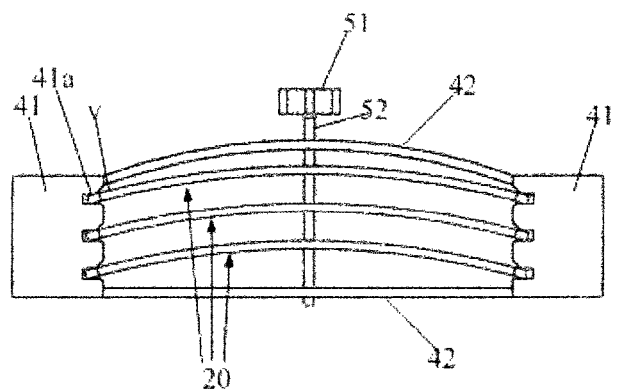
FIG. 7 is a cross sectional view taken along the xoy plane in FIG. 6.

It should be noted that the position of the transparent display panel 21 in a z-axis direction in FIGS. 4 and 6 should be kept constant, that is, it does not move back and forth in the z-axis direction, thus the transparent display panel 21 is driven to move close to or away from the driver 51 along the symmetrical middle plane between the two mounting blocks 41 when the driver 51 drives the threaded rod 52 to rotate about its axis, without rotating with the rotation of the threaded rod 52. Further, since the two ends of the display panel 20 are inserted into the mounting grooves 41a of the mounting blocks 41 and the positions thereof do not change, the transparent display panel 21 can be transformed from the planar state in FIGS. 4 and 5 to the bending state in FIGS. 6 and 7, and the curvature of the bending changes as an angle by which the threaded rod 52 rotates varies.

Further specifically, as shown in FIG. 3, the display screen 20 further comprises a fixing frame 22 surrounding the transparent display panel 21 and located in the same plane as the transparent display panel 21, and the transparent display panel 21 is fixedly connected to the fixing frame 22. The fixing frame 22 comprises two first fixing portions 221 arranged in a length direction or longitudinal direction of the transparent display panel 21 and two second fixing portions 222 arranged in a width direction or transverse direction of the transparent display panel 21. The first fixing portions 221 extend in the transverse direction of the transparent display panel 21, and the second fixing portions 222 extend in the longitudinal direction of the transparent display panel 21. The two ends of the display screen 20 in the longitudinal direction thereof extend into the mounting grooves 41a of the mounting blocks 41, that is to say, the two mounting blocks 41 are arranged in the longitudinal direction of the transparent display panel 21. A part of or all of the first fixing portions 221 extends into the mounting grooves 41a. As shown in FIGS. 4 and 6, the curvature adjustment structure comprises two drivers 51 and two threaded rods 52, each display screen 20 is provided with two threaded holes 22a corresponding to the two threaded rods 52, and the two threaded holes 22a are respectively located in the two second fixing portions 222 of the display screen 20. It should be understood that, as described above, the threaded holes 22a are provided at the middle of the display screen 20 in the arrangement direction of two mounting blocks 41 (i.e., the longitudinal direction of the display screen 20). Thus, in the case that the threaded holes 22a are provided in the second fixing portions 222, they are provided at the middle of the second fixing portions 222 in the longitudinal direction of the display screen 20.

It is possible to prevent the transparent display panel 21 from being damaged by the arrangement of the threaded holes 22a at the middle of the second fixing portions 222. When the threaded rod 52 is rotated, the middle portion of the second fixing portion 222 is driven to move close to or away from the driver 51 so that the second fixing portion 222 is bent and therefore the transparent display panel 21 is bent. In order to facilitate the adjustment of the bending curvature of the second fixing portion 222, the fixing frame 22 may be made of a flexible material, including polyformaldehyde (referred to as POM). The fixing frame 22 made of polyformaldehyde has a smooth surface, a high fatigue strength and a high bending strength, thereby it can avoid scratching the transparent display panel 21 and can easily adjust the curvature.

Further, as shown in FIGS. 4, 6 and 8, at least one pair of connection strips 42 are provided between the two mounting blocks 41, two ends of the connection strip 42 are respectively connected to the two mounting blocks 41, two paired connection strips 42 are respectively provided on either side of the plurality of display screens 20 in an arrangement direction thereof, a position of the connection strip 42 corresponds to a position of the second fixing portion 222, the connection strip 42 is provided with a guiding hole 42a corresponding to the threaded rod 52, and the threaded rod 52 passes through the corresponding guiding hole 42a. With reference to FIGS. 4 to 8, the threaded rod 52 successively passes through the guiding hole 42a in the first connection strip 42 of the pair of connection strips 42, the threaded holes 22a in the plurality of display screens 20, the guiding hole 42a in the second connection strip 42. The guiding hole 42a is not provided with any threads, so that the connection strip 42 can keep immovable when the threaded rod 52 is rotated. The guiding hole 42a can act as a guiding and positioning function for the threaded rod 52, so as to ensure the stability of the rotation of the threaded rod 52.

In an example, the connection strip 42 between the transparent display panel 21 and the rear cover 12 may be provided as an arc-shaped structure protruding towards the rear cover 12.

Figure 9:
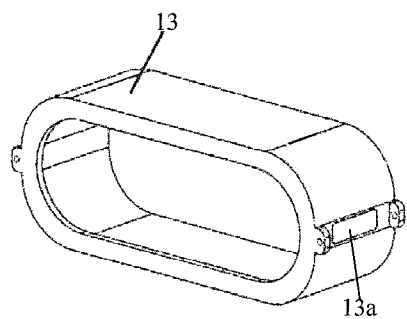
FIG. 9 is a schematic structural view of an annular casing of the head-mounted virtual reality device according to the embodiment of the present disclosure.

Further, as shown in FIGS. 8 and 9, the mounting block 41 is provided with a heat dissipation hole 41b, an opening of the heat dissipation hole 41b at one end faces towards an interior of the housing 10, an opening of the heat dissipation hole at the other end faces towards the annular casing 13, and a portion of the annular casing 13 corresponding to the heat dissipation hole 41b is formed as an opaque heat dissipation portion 13a. The arrangement of the heat dissipation hole 41b and the heat dissipation portion 13a can prevent excessive temperature of the transparent display panel 21 and the driver 51 in the housing 10 and therefore the shortening of their service lives. Herein, the heat dissipation portion 13a is made from a material comprising a thermally conductive carbon fiber, thereby the heat dissipation effect can be further improved.

In an example, the mounting block 41 may be of a solid structure, and the heat dissipation hole 41b may extend through the whole mounting block 41. Alternatively, the mounting block 41 may be of a hollow structure as shown in FIG. 8, including an upright portion and a bending portion, a hollow space being formed between the bending portion and the upright portion. The bending portion matches with a corresponding portion of the annular casing in the aspect of shape, and the heat dissipation hole 41b extends through the bending portion.

The head-mounted virtual reality device according to the embodiments of the present disclosure has been described above. It can be seen that, in the head-mounted virtual reality device according to the embodiments of the present disclosure, the different transparent display panels display images of different depth of field, and the images displayed by the plurality of transparent display panels are mixed to form a complete virtual scene. The image displayed by the transparent display panel closer to the user has a relatively smaller depth of field, and the image displayed by the transparent display panel farther from the user has a relatively larger depth of field. Therefore, when the user is watching, he/she will no longer see images of different depths of field at the same position, but see images of different depths of field at different positions. Thus, the position of focal point is allowed to be in correspondence with the depth of field of the image, further, it avoids dizziness, nausea and other symptoms caused by the fact that the user sees the images of different depths of field at the same focus for a long time in the related art, thereby improving the viewing experience for the user. In addition, the transparent display panel adopts an organic light-emitting diode display panel, providing a better display effect. Moreover, the transparent display panel is a flexible display panel, so that it can achieve a bending display. In this way, the user is more strongly immersed in the scene, thereby it provides a better viewing experience for the user. Also, a curvature adjustment structure is provided in the housing, so that the curvature of the transparent display panel can be adjusted, thereby satisfying the viewing demands of the users of different interpupillary distances.

It will be understood that the above embodiments are merely exemplary, and illustrative of the principles of the present disclosure, however, the present disclosure is not limited thereto. It will be apparent to those skilled in the art that various modifications and improvements can be made without departing from the spirit of the present disclosure, such modifications and improvements also fall within the scope of the present disclosure.

What is claimed is:

1. A display device comprising a housing, wherein a plurality of display screens are provided in the housing, and each display screen comprises a transparent display panel,
wherein the housing is provided with a viewing portion for viewing an image displayed on the transparent display panel, the plurality of display screens are successively arranged in a direction leaving away from the viewing portion, a plurality of the transparent display panels are configured for respectively displaying images at different depths of field in a same scene, and the image displayed on at least one of the plurality of the transparent display panel has a depth of field which is associated with a distance between the at least one of the plurality of the transparent display panels and the viewing portion;
wherein two mounting blocks are arranged opposite to each other in the housing, the display screens are arranged between the two mounting blocks, each mounting block is provided with mounting grooves each corresponding to one of the display screens, and two ends of the display screen in a longitudinal or transverse direction thereof respectively extend into the mounting grooves in the two mounting blocks; and wherein the transparent display panel is a flexible display panel, and a curvature adjustment structure is further provided in the housing for adjusting curvatures of the transparent display panels.

2. The display device according to claim 1, wherein the transparent display panel is an organic light-emitting diode display panel.

3. The display device according to claim 1, wherein in the mounting block, an inner wall of the mounting groove comprises a bottom wall facing the other mounting block and side walls connected to the bottom wall, and a chamfer surface is provided between the side wall of the mounting groove and a surface of the mounting block facing the other mounting block.

4. The display device according to claim 3, wherein the curvature adjustment structure comprises at least one driver and a threaded rod connected to the driver, the driver is configured for driving the threaded rod to rotate about its own axis, and the driver is fixedly provided on the housing.

5. The display device according to claim 4, wherein each display screen is provided with a threaded hole matching with the threaded rod at a symmetrical middle plane between the two mounting blocks, and the threaded rod successively passes through the threaded holes of the plurality of display screens matching with the threaded rod.

6. The display device according to claim 5, wherein the display screen further comprises a fixing frame surrounding the transparent display panel and located in a same plane as the transparent display panel, the transparent display panel is fixedly connected to the fixing frame, the fixing frame comprises two first fixing portions arranged in a longitudinal direction of the transparent display panel and two second fixing portions arranged in a transverse direction of the transparent display panel, the two ends of the display screen in the longitudinal direction thereof extend into the mounting grooves of the mounting blocks, and the fixing frame is made of a flexible material.

7. The display device according to claim 6, wherein the curvature adjustment structure comprises two drivers and two threaded rods, each display screen is provided with two threaded holes corresponding to the two threaded rods, and the two threaded holes are respectively located in the two second fixing portions of the display screen.

8. The display device according to claim 7, wherein at least one pair of connection strips are provided between the two mounting blocks, two ends of each connection strip are respectively connected to the two mounting blocks, two paired connection strips are respectively provided on either side of the plurality of display screens in an a direction along which they are arranged, a position of the connection strip corresponds to a position of the second fixing portion, the connection strip is provided with a guiding hole corresponding to the threaded rod, and the threaded rod passes through the corresponding guiding hole.

9. The display device according to claim 6, wherein the flexible material comprises polyformaldehyde.

10. The display device according to claim 1, wherein the housing comprises a front cover, a rear cover opposite to the front cover, and an annular casing disposed between the front cover and the rear cover, and the mounting block is disposed inside the annular casing.

11. The display device according to claim 10, wherein the mounting block is provided with a heat dissipation hole, an opening of the heat dissipation hole at one end faces towards an interior of the housing, an opening of the heat dissipation hole at the other end faces towards the annular casing, and a portion of the annular casing corresponding to the heat dissipation hole is formed as an opaque heat dissipation portion.

12. The display device according to claim 11, wherein the heat dissipation portion is made from a material comprising a thermally conductive carbon fiber.

13. The display device according to claim 1, wherein the housing comprises a front cover, a rear cover opposite to the front cover, and an annular casing disposed between the front cover and the rear cover, the front cover is provided with a mounting hole, and the viewing portion comprises a lens disposed in the mounting hole.

14. The display device according to claim 13, wherein a light shielding sheet is provided between the rear cover and the annular casing.

15. The display device according to claim 2, wherein the housing comprises a front cover, a rear cover opposite to the front cover, and an annular casing disposed between the front cover and the rear cover, the front cover is provided with a mounting hole, and the viewing portion comprises a lens disposed in the mounting hole.

16. The display device according to claim 15, wherein a light shielding sheet is provided between the rear cover and the annular casing.

* * * * *